US006875025B2

(12) United States Patent
Hsu et al.

(10) Patent No.: US 6,875,025 B2
(45) Date of Patent: Apr. 5, 2005

(54) MATRIX SOCKET

(75) Inventors: Chien-Yu Hsu, Taoyuan Hsien (TW); Yen-Jang Liao, Taoyuan Hsien (TW); Li-Sen Chen, Taoyuan Hsien (TW)

(73) Assignee: Speed Tech Corp., Taoyuan Hsien (TW)

( * ) Notice: Subject to any disclaimer, the term of this patent is extended or adjusted under 35 U.S.C. 154(b) by 0 days.

(21) Appl. No.: 10/679,332

(22) Filed: Oct. 7, 2003

(65) Prior Publication Data

US 2005/0037650 A1 Feb. 17, 2005

(30) Foreign Application Priority Data

Aug. 11, 2003 (TW) ....................................... 92122012 A

(51) Int. Cl.[7] ........................... H01R 12/00; H05K 1/00
(52) U.S. Cl. ......................................... 439/71; 439/140
(58) Field of Search .................. 439/268, 81, 265–266, 439/83, 70–71, 140–141

(56) References Cited

U.S. PATENT DOCUMENTS 2,992,401 A * 7/1961 Lewis ........................ 439/212
5,215,472 A * 6/1993 DelPrete et al. .............. 439/71
5,247,250 A 9/1993 Rios ....................... 324/158 F
5,498,970 A 3/1996 Petersen ..................... 324/755
6,149,449 A 11/2000 Abe ........................... 439/268
6,280,219 B1 8/2001 Sano et al. ................. 439/268

* cited by examiner

*Primary Examiner*—Javaid H. Nasri
(74) *Attorney, Agent, or Firm*—Rabin & Berdo, P.C.

(57) ABSTRACT

A matrix socket includes a first insulating housing, a second insulating housing and a plurality of terminal assemblies. Each terminal assembly has a movable terminal and terminal seat. The first insulating housing and the second insulating housing are corresponding to each other, and have accommodating channels for placing the terminal assemblies therein, so as to enable the movable terminals and the terminal seats become electrically connected in a slidable manner.

5 Claims, 7 Drawing Sheets

MATRIX SOCKET

BACKGROUND OF THE INVENTION (a) Field of the Invention

The invention relates to a matrix socket, and more particularly, to a matrix socket having a high terminal density, and is used for testing whether an integrated circuit achieves expected specifications.

(b) Description of the Prior Art

A desirable testing socket for integrated circuits must at least have the following characteristics:

1. keeping terminals of an integrated circuit undamaged; or else, an originally qualified integrated circuit may become an unqualified product due to terminal damages caused during testing process thereof; and
2. being electrically connected with all terminals in an integrated circuit; in an integrated circuit, quantity of terminals varies from as few as tens to as many as hundreds, and therefore it is essential that a testing socket be electrically connected with all the terminals in the integrated circuit to completely perform testing of the integrated circuit.

For that conventional terminals in an integrated circuit are made of metal materials, these integrated circuit terminals have excellent mechanical strength, and a testing socket for integrated circuits can thus be electrically connected with the integrated circuit terminals directly by clamping means. Such type of integrated circuit terminals made of metal materials is generally electrically connected with circuits in electronic devices by surface mounting technology (SMT type) or through hole (DIP type).

Owing to increase in terminal densities of conventional integrated circuits is the latest trend, industrial mass production of circuits at circuit boards in integrated circuits using the conventional SMT and DIP is made more and more difficult. Hence, metal terminals of integrated circuits are gradually replaced by solder balls. However, testing complications of packaged and assembled integrated circuits having solder ball terminals are caused as a result.

Surfaces of solder ball terminals have extremely low mechanical strength, and are also soft with high plasticity. Therefore, when using a testing socket for testing an integrated circuit, with solder ball terminals the solder balls are highly liable to deformation from excessive clamping forces or may even disengage from the integrated circuit. Prior techniques disclosed in the U.S. Pat. Nos. 5,498,970, 6,149,449 and 6,280,219 are not exempt from the above shortcoming.

Referring to the U.S. Pat. No. 5,247,250, wherein terminals of a testing socket disclosed come into contact with lower surfaces of solder balls, the terminals are instead easily shorted and the structure is hardly reliable.

To overcome the aforesaid drawbacks, the invention provides a matrix socket serving as not only an integrated circuit testing socket but also a common land grid array (LGA) socket.

SUMMARY OF THE INVENTION

The primary object of the invention is to provide a matrix socket, wherein terminals thereof have lower stress.

The secondary object of the invention is to provide a matrix socket capable of performing normal functions even under poor planer surface conditions of integrated circuits terminals or printed circuit boards (PCB).

A matrix socket according to the invention comprises a plurality of terminal assemblies disposed in a first insulating housing and a second insulating housing. The first insulating housing is stacked on the second insulating housing in a vertical direction as illustrated in descriptions and shown in the diagram of the invention. The first insulating housing has first accommodating channels in a quantity corresponding to that of the terminal assemblies, and the second insulating housing has second accommodating channels corresponding to individual first accommodating channels of the first insulating housing. Each terminal assembly has a movable terminal and a terminal seat. The movable terminals disposed in the first accommodating channels are capable of sliding movements in the first accommodating channels. Each movable terminal has a contact section at an upper edge of the first accommodating channel for electrical connection with a complement circuit board, so as to become electrically connected with an integrated circuit or circuit contacts of a circuit located above the first insulating housing. Each terminal seat is disposed in a second accommodating channel, and includes at least a contact arm and an extension section located at an upper portion and a lower portion of the second accommodating channel, respectively. The contact arms of the terminal seats are for electrically connecting with the movable terminals, and the extension sections of the terminal seats are for electrically connecting with an integrated circuit or circuit contacts of a circuit located below the second insulating housing.

According to the invention, each terminal assembly is consisted of a movable terminal and a terminal seat, wherein positions of the movable terminals relative to the terminal seats are adjustable by sliding movements thereof, and electric connection between the movable terminals and the terminal seats are accomplished by having the contact arms of the terminal seats come into contact with the movable terminals. Hence, contact stress of the terminal assemblies is only related to the frictions between the movable terminals and the terminal seats.

The contact arms of the terminal seats maintain constant contact with the movable terminals, and perform a continuous wiping effect at surfaces of the movable terminals during movements of the movable terminals. Consequently, dust and oxides can hardly be adhered at the contact surfaces between the contact arms of the terminal seats and the movable terminals, thereby providing an enhanced conducting efficiency.

According to the invention, a travel range of each terminal assembly is quite large, and therefore poor contact is prevented when the terminal assemblies are applied to integrated circuits or printed circuit boards having poor surface planes.

DETAILED DESCRIPTION OF THE PREFERRED EMBODIMENTS

Figure 1:
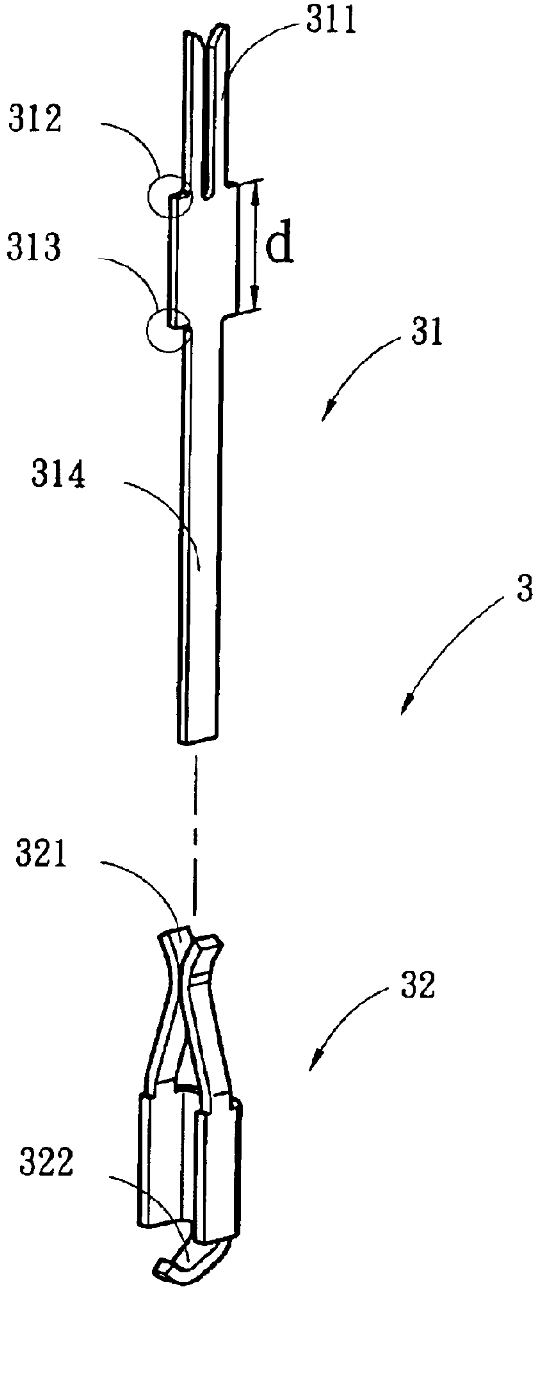
FIG. 1 shows an exploded elevational view of a first embodiment according to the invention.
Figure 2:
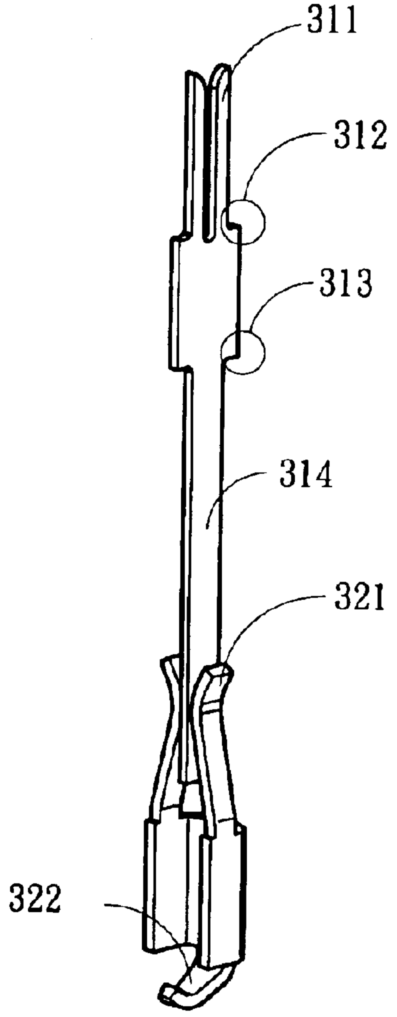
FIG. 2 shows elevational view of a first embodiment according to the invention.
Figure 3A:
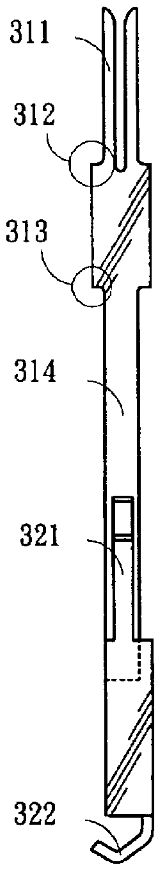
FIGS. 3A & 3B show a terminal and a schematic drawing of the sectional view of an embodiment according to the invention, respectively.
Figure 3B:
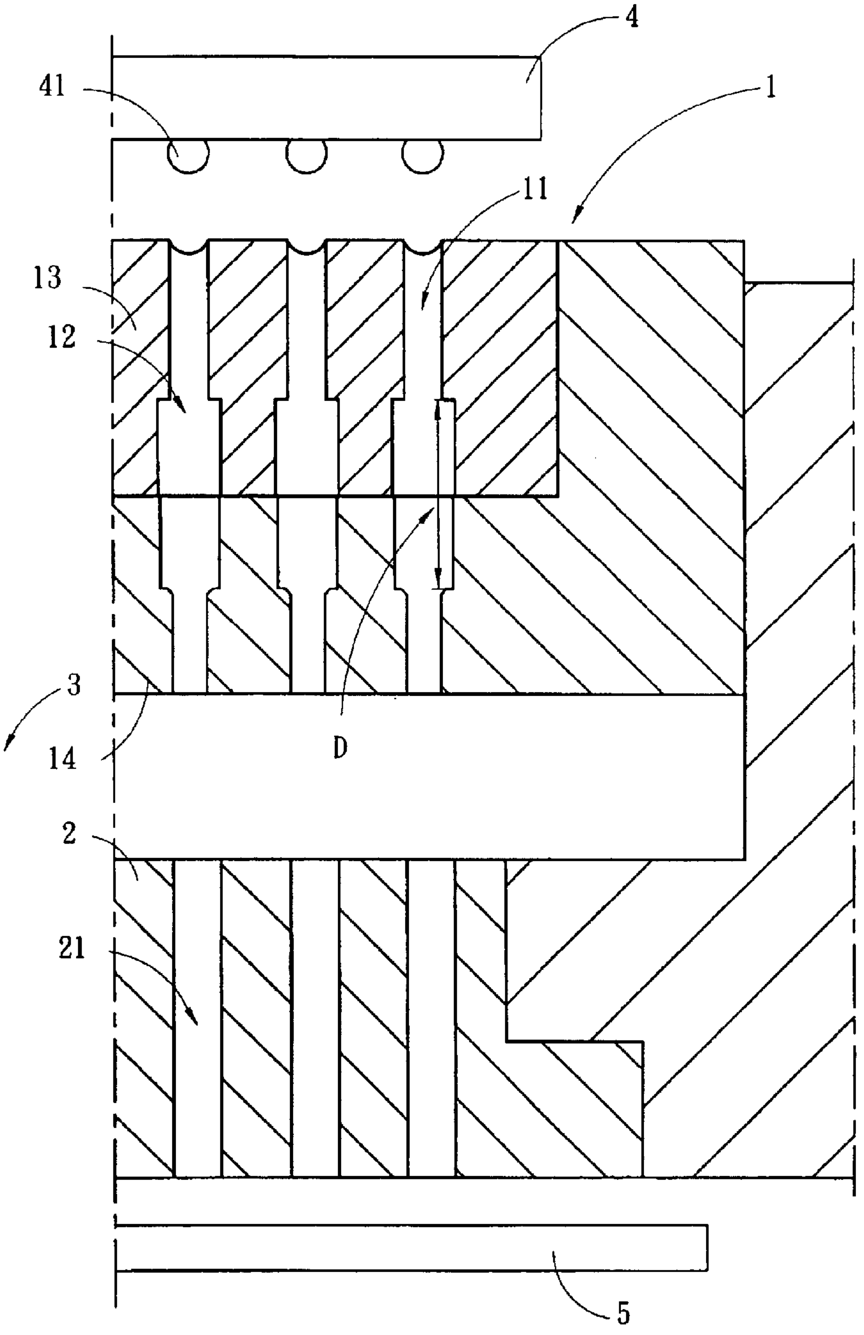
Figure 4:
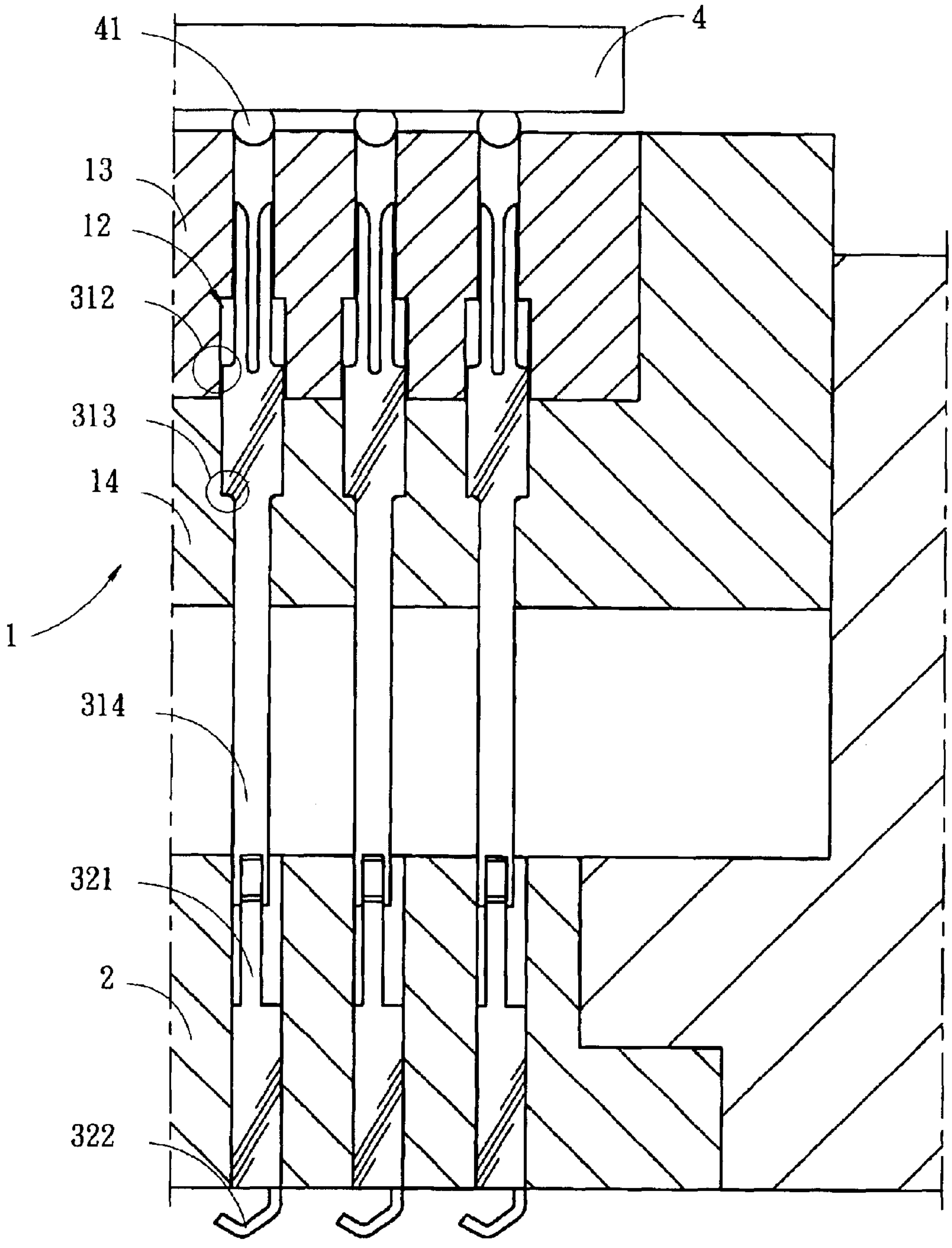
FIG. 4 shows a first sectional schematic view illustrating movements of a first embodiment according to the invention.
Figure 5:
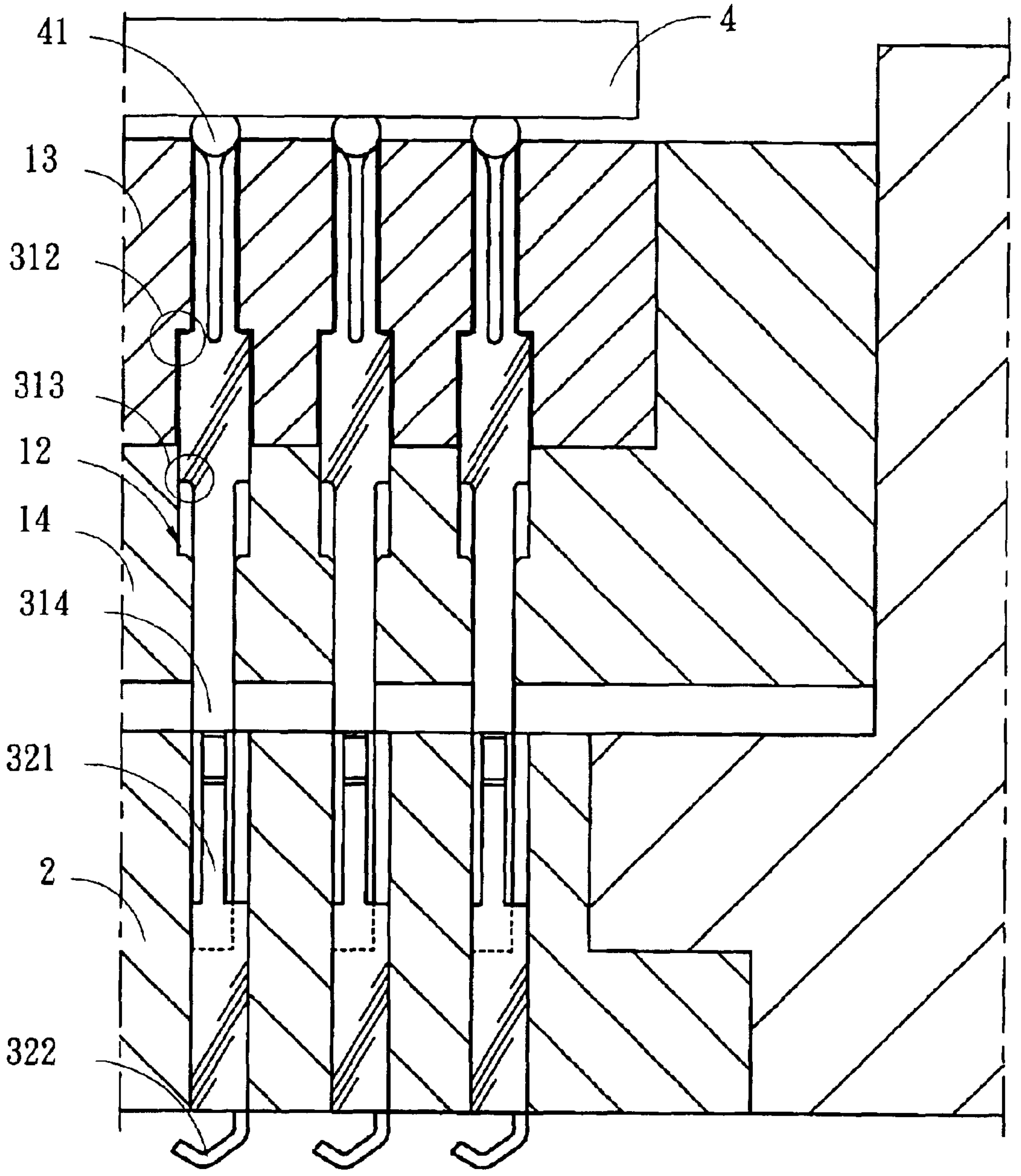
FIG. 5 shows a second sectional schematic view illustrating movements of a first embodiment according to the invention.
Figure 6:
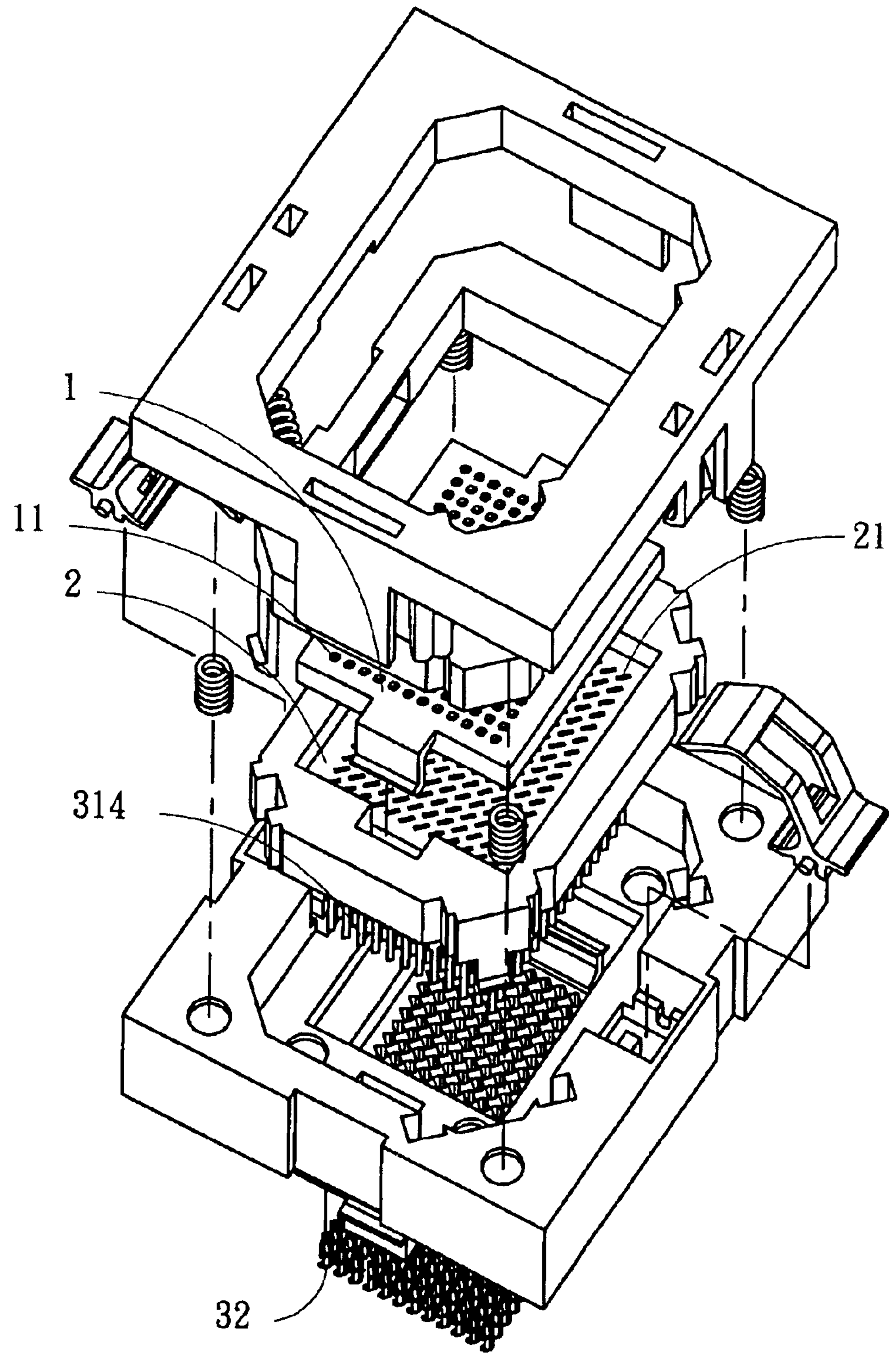
FIG. 6 shows an exploded elevational perspective view according to the invention.

To better understand the invention, detailed descriptions shall be given with the accompanying drawings below.

Referring to FIGS. 1 to 6, a matrix socket according to the invention comprises a first insulating housing 1, a second insulating housing 2 and a plurality of terminal assemblies 3. The first insulating housing 1 has first accommodating channels 11 in a quantity corresponding to that of the terminal assemblies 3, and the second insulating housing 2 has second accommodating channels 21 corresponding to individual first accommodating channels 11 of the first insulating housing 1. Each terminal assembly 3 has a movable terminal 31 and a terminal seat 32. Each movable terminal 31 is disposed in the first accommodating channel 11, and has a contact section extending out of an upper portion of the first accommodating channel 11 which comes into contact and electrically connects with a solder ball 41 of an integrated circuit located above the first insulating housing 1. Each terminal seat 32 includes two, for example, contact arms 321 and an extension section 322, which extend toward a corresponding second accommodating channel 21. The contact arms 321 of the terminal seats 32 and the movable terminals 31 are electrically connected in a slidable manner. The extension sections 322 at the terminal seats 32 of the terminal assemblies 3 are provided with elasticity and can be electrically connected with circuit contacts of a circuit board 5.

The movable terminals 31 of the terminal assemblies 3 are electrically connected with the terminal seats 32 by coming into contact with the contact arms 321 of the terminal seats 32. When the solder balls 41 of the integrated circuit 4 above the first insulating housing 1 have smaller external diameters, a travel range of the movable terminals 31 pushed downward by the solder balls 41 of the integrated circuit is also relatively smaller. Therefore, each movable terminal 31 is further formed with a rear section 314 extended from a lower edge thereof, so as to enable the contact arms 321 at of the terminal seats 32 to more easily come into contact and electrically connect with the movable terminals 31.

During movements of the movable terminals 31, the contact arms 321 of the terminal seats 32 are maintained in contact with the surfaces of the movable terminals 31. In presence of dirt such as oxides or dust at the contact surfaces between the movable terminals 31 and the contact arms 321, the dirt is wiped off by sliding movements of the movable terminals 31.

To allow the structure disclosed by the invention to be used repeatedly, each first accommodating channel 11 of the first insulating housing 1 may be additionally provided with a retaining region 12. Each retaining region 12 has slightly larger dimensions than a horizontal width of the first accommodating channels 11 in this embodiment. In each retaining region 12, a movable terminal 31 therein is also additionally provided with a shoulder section 312 and an elbow section 313 for corresponding with the retaining sections 12 of the first accommodating channels 11. It is to be noted that, a distance d between the shoulder sections 312 and elbow sections 313 of the movable terminals 31 is necessarily smaller than a length D of the retaining regions 12.

If the integrated circuit or a PCB imposes a downward force to the first insulating housing 1, the contact sections 311 of the movable terminals 31 are moved downward due to pressing forces from the solder balls 41. If the downward forces are removed, the first insulating housing 1 may be lifted to have lower edges of the retaining regions 12 raise the elbow sections 313 of the movable terminals 31, thereby restoring the movable terminals 31 to original positions thereof and providing repeated use.

To assist those who are skilled in this art, wherein retaining regions 12 are provided in the first insulating housing 1, a feasible design according to the invention shall be illustrated. The first insulating housing 1 may be consisted of a first insulating assembly 13 and a second insulating assembly 14. The retaining regions 12 has a portion thereof formed at a lower portion of the first insulating assembly 13 by means of molding, and a remainder portion formed at an upper portion of the second insulating assembly 14 by means of molding as well, thereby forming a complete retaining region 12 by mounting the first insulating assembly 13 to the second insulating assembly 14.

According to the matrix socket disclosed by the invention, two ends of the terminal assemblies, that is, the contact sections 311 of the movable terminals 31 and the extension sections 322 of the terminal seats 32, do not need to be soldered or fastened to the solder balls 41 of the integrated circuit 3 or the circuit contacts of the circuit board 5. However, based upon practical needs, common solder means can still be adopted.

Figure 7:
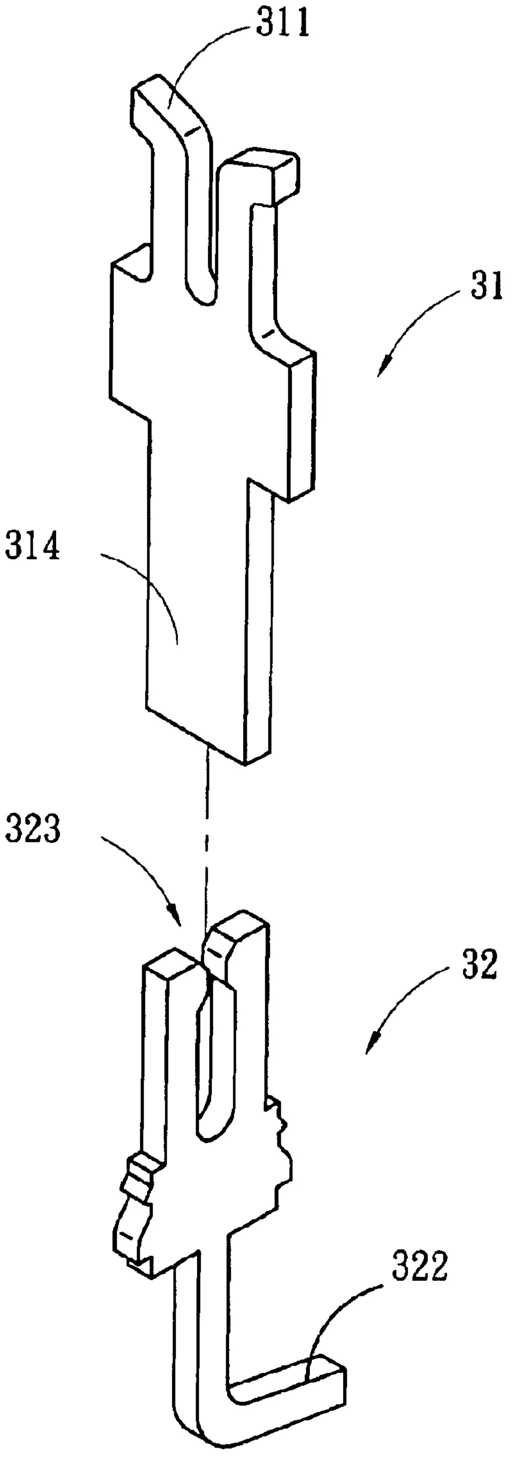
FIG. 7 shows an exploded elevational view illustrating a terminal assembly in a second embodiment according to the invention.
Figure 8:
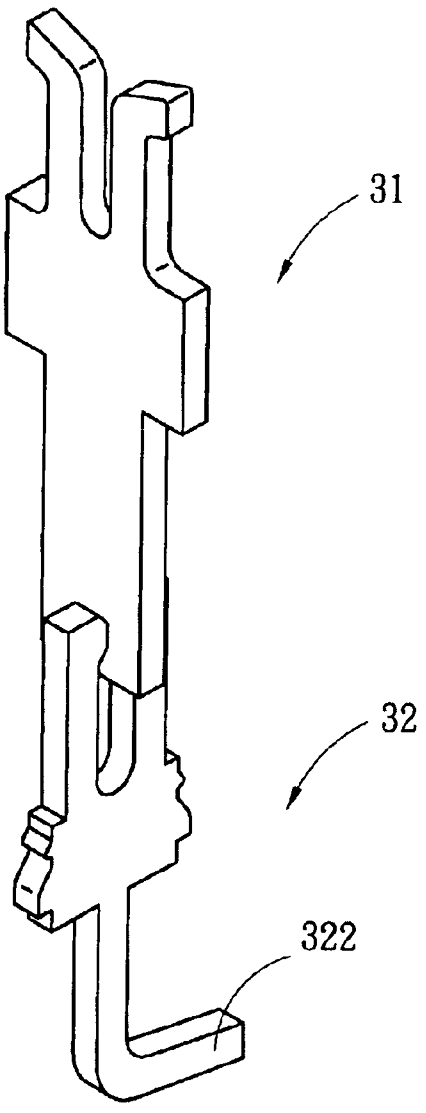
FIG. 8 shows an elevational view illustrating a terminal assembly in a second embodiment according to the invention.

Referring to FIGS. 7 and 8 showing a second embodiment according to the invention, each terminal seat 32 of the terminal assemblies 3 may be a blanking terminal.

In the second embodiment according to the invention, each terminal seat 32 has two contact arms 321, and between the two contact arms 321 is a guiding groove 323, so as to allow the rear sections 314 of the movable terminals 31 to slide in the guiding grooves 323. A smallest distance of the guiding grooves 323 between the contact arms 321 is slightly smaller than a thickness of the rear sections 314 of the movable terminals 31, so as to ensure that the rear sections 314 of the movable terminals 31 maintain electrically connected with both the contact arms 314 at all time.

Figure 9:
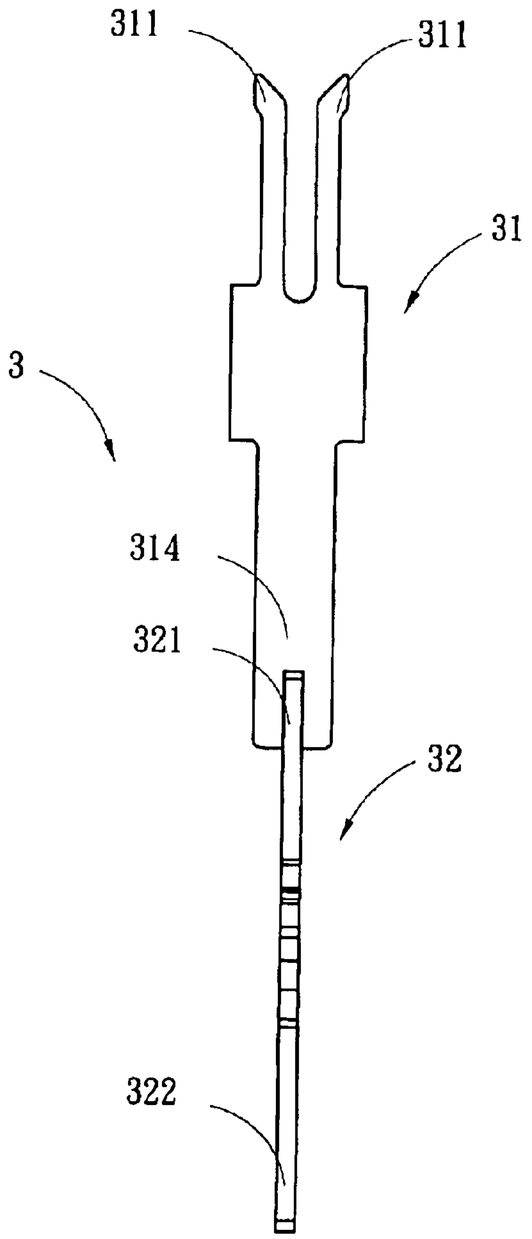
FIG. 9 shows an elevational view illustrating an assembled terminal assembly in a third embodiment according to the invention.
Figure 10:
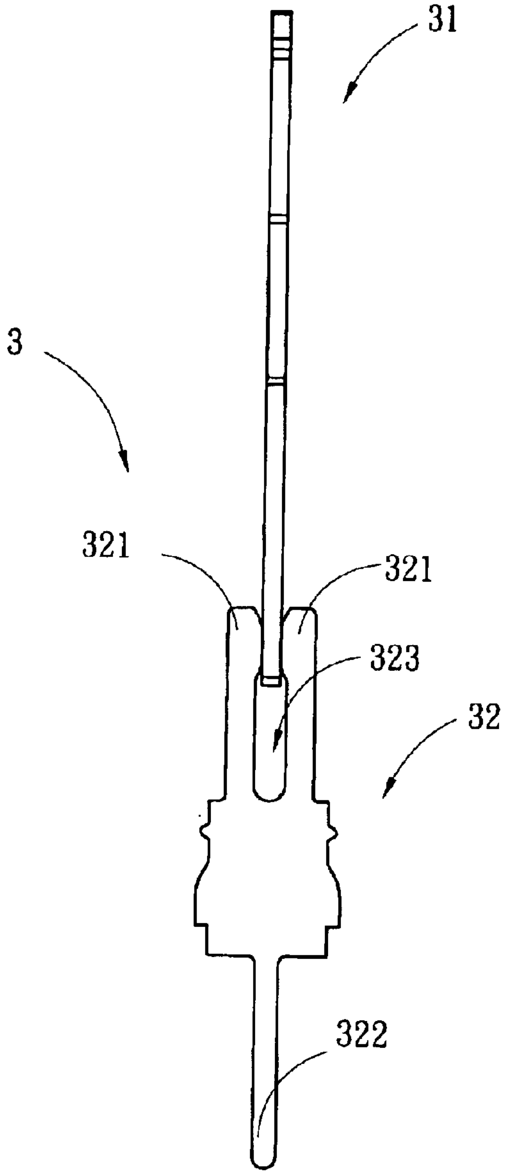
FIG. 10 shows a right side view illustrating an assembled terminal assembly in a third embodiment according to the invention.

Referring to FIGS. 9 and 10, the extension sections 322 of the terminal seats 32 according to this embodiment may be extended straight downward and penetrated through a circuit board, such that each terminal 32 is made into a DIP terminal.

By making the terminal seats 32 into DIP terminals, the entire socket or the terminal assemblies 3 of the socket can be more easily fastened at or soldered to the circuit board.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A matrix socket comprising a first insulating housing, a second insulating housing and a plurality of terminal assemblies; wherein:

the first insulating housing has first accommodating channels in a quantity corresponding to that of the terminal assemblies; the second insulating housing has second accommodating channels corresponding to individual first accommodating channels of the first insulating housing; each terminal assembly has a movable terminal and a terminal seat; the movable terminals are disposed in the first accommodating channels and are extended toward a top portion of the first accommodating channels to form contact sections; each terminal seat is placed in the second accommodating channel, and is extended toward a corresponding second accommodating channel to form at least one contact arm and an extension section; and the contact arms of the terminal seats are electrically connected with the movable terminals in a slidable manner;

wherein each first accommodating channel of the first insulating housing comprises a retaining region, each retaining region has dimensions slightly larger than a horizontal width of the first accommodating channels, and each movable terminal further has a shoulder section and an elbow section in the retaining region, with a distance between the shoulder sections and the elbow sections of the movable terminals being smaller than a length of the retaining regions.

2. The matrix socket in accordance with claim 1, wherein the first insulating housing is formed by mounting a first insulating assembly to a second insulating assembly, and the retaining regions of the first accommodating channels are formed at a lower portion of the first insulating assembly.

3. The matrix socket in accordance with claim 2, wherein the retaining regions of the first accommodating channels are formed after mounting the first insulating assembly to the second insulating assembly.

4. The matrix socket in accordance with claim 1, wherein each elbow section of the movable terminals is extended toward the second accommodating channel to form a rear section having a smaller sectional area, thereby electrically connecting with the contact arms of the terminal seats using the rear sections.

5. A matrix socket comprising a first insulating housing a second insulating housing and a plurality of terminal assemblies; wherein:

the first insulating housing has first accommodating channels in a quantity corresponding to that of the terminal assemblies; the second insulating housing has second accommodating channels corresponding to individual first accommodating channels of the first insulating housing; each terminal assembly has a movable terminal and a terminal seat; the movable terminals are disposed in the first accommodating channels and are extended toward a top portion of the first accommodating channels to form contact sections; each terminal seat is placed in the second accommodating channel, and is extended toward a corresponding second accommodating channel to form at least one contact arm and an extension section; and the contact arms of the terminal seats are electrically connected with the movable terminals in a slidable manner; and wherein the extension sections of the terminal seats are provided with elasticity, and are deformed when the second insulating housing receives a downward force.

* * * * *